(12) United States Patent
Stoddard et al.

(10) Patent No.: US 10,421,208 B2
(45) Date of Patent: Sep. 24, 2019

(54) METHOD AND DEVICE FOR CLEAVING WAFERS

(71) Applicant: SUNPOWER CORPORATION, San Jose, CA (US)

(72) Inventors: Nathan Stoddard, Beaverton, OR (US); Bjoern Seipel, Portland, OR (US)

(73) Assignee: SUNPOWER CORPORATION, San Jose, CA (US)

( * ) Notice: Subject to any disclaimer, the term of this patent is extended or adjusted under 35 U.S.C. 154(b) by 286 days.

(21) Appl. No.: 13/795,896

(22) Filed: Mar. 12, 2013

(65) Prior Publication Data

US 2014/0263524 A1 Sep. 18, 2014

(51) Int. Cl.
| | |
|---|---|
| *B26F 3/00* | (2006.01) |
| *C30B 29/06* | (2006.01) |
| *C30B 33/06* | (2006.01) |
| *H01L 31/18* | (2006.01) |
| *H01L 21/67* | (2006.01) |

(52) U.S. Cl.
CPC .............. *B26F 3/002* (2013.01); *C30B 29/06* (2013.01); *C30B 33/06* (2013.01); *H01L 31/18* (2013.01); *H01L 21/67092* (2013.01); *Y10T 225/12* (2015.04)

(58) Field of Classification Search
CPC ........... C30B 1/12; C30B 29/06; C30B 33/06; H01L 21/02532; H01L 21/02667; H01L 31/03921; H01L 31/1804; H01L 31/1896; H01L 21/67092; H01L 31/18; Y02E 10/547; B26F 3/002
See application file for complete search history.

(56) References Cited

U.S. PATENT DOCUMENTS

| | | | |
|---|---|---|---|
| 2002/0000242 A1* | 1/2002 | Matushiita | H01L 31/02242 136/244 |
| 2008/0179547 A1* | 7/2008 | Henley | H01L 21/76254 250/492.21 |
| 2009/0056513 A1* | 3/2009 | Baer | B23K 26/0057 83/15 |
| 2012/0017970 A1* | 1/2012 | Cheung | H01L 31/03921 136/251 |
| 2012/0234887 A1* | 9/2012 | Henley | H01L 21/67092 225/1 |

* cited by examiner

*Primary Examiner* — Hua Qi
(74) *Attorney, Agent, or Firm* — Xsensus LLP (57) ABSTRACT

A method for cleaving wafers comprising the following steps: providing a slice of a crystalline material with at least a first plane side, providing at least one stressing means to be attached to said slice, wherein said at least one stressing means is at least in parts made of a material with a coefficient of thermal expansion different from that of the slice, attaching said stressing means to said first plane side of said slice to form a stack, inducing a thermal shear stress to said slice by applying a temperature change to said stack.

24 Claims, 5 Drawing Sheets

METHOD AND DEVICE FOR CLEAVING WAFERS

FIELD OF THE INVENTION

The invention relates to a method for cleaving wafers. The invention further relates to a device for cleaving wafers.

BACKGROUND OF THE INVENTION

One step in the production of silicon wafers for solar cells is the separation of such wafers from silicon bricks usually done by wire saws. However, the wire sawing process leads to a rather high percentage of material loss.

SUMMARY OF THE INVENTION

It is an object of the invention to improve a method for the production of wafers. It is in particular an object of the invention to provide a method, which provides a significantly higher mass yield of wafers from the starting silicon block, and that the process be capable of making wafers with thicknesses from 180 microns down to 40 microns. This objective is solved by a method for cleaving wafers comprising the following steps: Providing a slice of a crystalline material with at least a first plane side, providing at least one stressing means to be attached to said plane side of the slice, wherein said at least one stressing means is at least in parts made of a material with a coefficient of thermal expansion (CTE) different from that of said slice, attaching said stressing means to said first plane side of said slice to form a stack, and inducing a shear stress to said slice by applying a temperature change to said stack. The stressing means can be attached directly to said slice. It is also possible, to attach the stressing means to said slice by means of an intermediate layer, in particular by means of a bonding agent.

Advantageously, the method according to the invention uses the fact that by attaching a stressing means with a coefficient of thermal expansion different from that of a silicon crystal to said crystal and applying a temperature change to this combination, a shear stress can be generated in the silicon crystal. It was found that this shear stress can be precisely controlled by controlling the temperature change, based on the difference between the coefficient of thermal expansion of the stressing means and the silicon slice.

The slice of crystalline material can in particular be a slab of silicon. It can in particular be cut from a silicon block. It can in particular be wire sawn from a silicon block, such as a silicon ingot. The slab can have a cylindrical or cuboid, in particular a rectangular cuboid shape. It has in particular a thickness in the range of 0.3 mm to 300 mm, in particular in the range of 0.5 mm to 100 mm, in particular in the range of 1 mm to 50 mm.

According to an aspect of the invention the thermal shear stress is induced to said slice by cooling down said stack comprising the slice and the stressing means attached thereto. The stack can in particular be cooled down from room temperature, i.e. from about 20° C. Alternatively, it can be cooled down from the bonding temperature of a particular bonding agent, for example around 90° C. for a bonding wax. For cooling it can be placed in a cold environment. It can also be brought in contact with a cooled body.

Preferably, the temperature range of the entire cleaving process is in the range of −200° C. to +80° C., in particular in the range of less than 50° C., in particular in the range of less than 30° C.

The temperature change applied to induce the thermal stress can be in the range of 10 K to 300 K, in particular in the range of 30 K to 150 K, in particular in the range of 50 K to 100 K.

Furthermore, it was found that the rate of cooling down plays an important role for the cleaving process. It was found, that the uniformity of the cooling in the plane of the soon-to-be wafer must be quite good, with non-zero thermal gradients only perpendicular to the plane. Cooling should be as fast as possible to optimize the productivity of the process, but must maintain this planarity of isotherms, especially as the target cleaving temperature is approached. Furthermore, as the critical temperature is approached, the cooling must be closely controlled so as not to overshoot the target temperature and so as not to cause premature spontaneous crack propagation. The rate of cooling preferably amounts to at least 10 K per minute, in particular at least 20 K per minute.

Furthermore, it was found, that to insure, that the wafer thickness will be on target, the temperature should never dip more than five K below the target cleaving temperature and the final temperature should not deviate from the target temperature by more than two degrees.

In general the stress applied to said slice of silicon comprises a shear component and a normal component. Both components can be applied to said slice by way of said stressing means. The normal stress is in the following also denoted as mechanical stress, whereas the shear stress is in the following also denoted as thermal stress.

According to an aspect of the invention the stressing means comprises a stressing layer. The stressing layer can be formed as a block, slab, sheet, as a perforated or mesh-like structure, or in form of a deposition.

The stressing layer can in particular be formed by way of a physical vapor deposition (PVD). It is in particular envisaged to apply a layer of aluminum in a PVD-process as a stressing layer. According to an alternative embodiment the stressing layer is formed by applying liquid gallium to the slice. The stressing layer can in particular comprise a coating being applied to said first plane side of said slice.

The stressing layer preferably has a cross section which is a least as large as the cross section of the slice of crystalline material. The stressing layer can have the same or a larger cross section than the crystalline slice.

The stressing layer preferably has a thickness in the range of 0.1 mm to 10 mm. The thickness of the layer has to be chosen carefully, in relation to the stiffness of the layer (i.e. the Young's modulus), the CTE of the layer, and the desired thickness of the wafer. Generally speaking, the higher the CTE, the lower the temperature change that will be necessary to produce a given thickness of a wafer. It was also found that an increase in Young's modulus will also decrease the necessary temperature change for a given wafer thickness.

Furthermore, it can be advantageous to choose a material or an embodiment of the stressing means, such that the stressing means is at least in some regions transparent to UV-light. Preferably, the stressing layer is entirely made of a material, which is transparent to UV-light. The coefficient of transmission of the stressing layer with respect to UV-light is preferably above 50%. The benefit here is the potential use of an epoxy or adhesive that cures with exposure of UV light. This is preferable to waiting for a curing process that is reaction limited or determined by thermal changes. Unfortunately, many of the most suitable materials (high CTE, high stiffness) are metallic and not transparent for UV light. However, there are some polymeric materials with very high CTE and moderate stiffness. Examples for such materials are epoxy, polycarbonate and polyimide.

According to a further aspect of the invention, the stressing means is at least in parts made of a material with a coefficient of thermal expansion (CTE) of at least 5 ppm/K, in particular at least 10 ppm/K, in particular at least 50 ppm/K, in particular at least 200 ppm/K. Herein the coefficient of thermal expansion is defined as the relative linear chance in length $\Delta L/L$ divided by the difference in temperature $\Delta T$, $CTE=(\Delta L/L)/\Delta T$.

Useful materials for the stressing means are for example metals, in particular, aluminum (23 ppm/K), silver, gallium (130 ppm/K), copper, zinc, manganese and their compounds, steel, plastic, in particular acrylic, polycarbonate (PC), in particular glass-filled PC. According to a further aspect of the invention the stressing means is at least in parts, preferably entirely made of one or more of such materials. The stressing means can be made of a single material. It can also be made of a combination of two or more of the aforementioned materials.

According to a further aspect of the invention, the stressing means is bonded to said slice by means of one the following bonding agents: glue, wax, resin, phase transforming liquid. Advantageous bonding agents are in particular cyanoacrylate, epoxy, organic wax or dissolvable substances. Also water can be used as a bonding agent. It can excerpt its bonding function simply by freezing. The bonding agent can be a composite material as well, for example one of the aforementioned materials mixed with a powder of high strength material to make a stronger matrix.

The bonding agent can be in particular made of a material different from the material of the stressing means. By that, it is possible to optimize the properties of the two materials independently.

Preferably the bonding process is easily reversible. The debonding can for example be done by heating. This is particularly easy in case of water or a low melting point metal, such as gallium, as a bonding agent. Alternatively, the debonding can be done by a chemical reaction. If the chemical reaction has to proceed from the edges in, then the debonding can take quite a long time. If the stressing layer is perforated with a regular matrix of openings then chemical processes can proceed much more quickly based on the greater access through the perforations. The potential trade-off is that, if the perforating openings are too large, then they will affect the local stress distribution, possibly causing local thickness variations. Alternately, the debonding might proceed by a thermal process, for example exceeding a given temperature for the thermal breakdown of an adhesive.

According to a further aspect of the invention, the stressing layer is configured such that it is permeable for chemicals. This facilitates the debonding process.

According to a further aspect of the invention a notch is applied to said slice. The notch may be applied either before or after the temperature change is applied to said stack. The notch serves as a crack initiation site. It is applied at a predetermined distance from said first plane side. It can be applied before or after attaching the stressing means to the slice. It can be applied by way of laser scribing or mechanically, in particular by a means of a diamond knife. The notch can in particular be applied by a sharp point source, such as an indenter, an ion beam, a water jet or a laser. Similarly, the notch can be applied by a well-defined line source, such as a laser beam or a knife, in particular a diamond knife.

Figure 4:
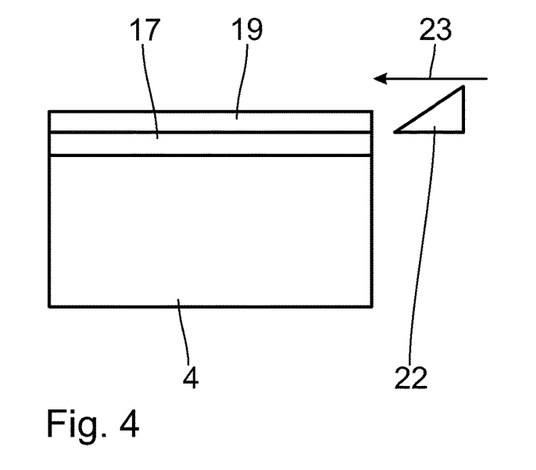
FIG. 4 a side view of another device for cleaving wafers.
Figure 5:
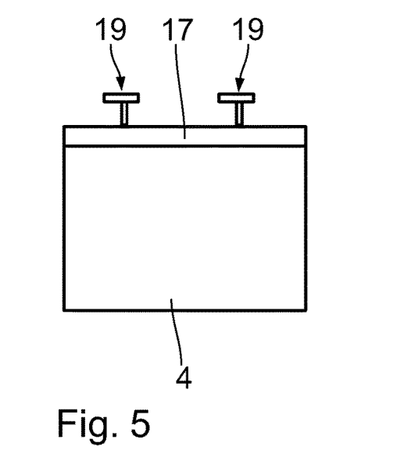
FIG. 5 a front view of the device according to FIG. 4.

According to a further aspect of the invention, the stressing means comprises a handle. A mechanical force is applied to the slice by applying a mechanical force, in particular a force with a component perpendicular to the plane side of the slice, in particular a force perpendicular to the plane side of the slice to said handle. The handle can be in the shape of a rail or several parallel rails. In order to apply a mechanical force to said handle a moving, wedge shaped guide can be made to interact with such a rail style handle. By using a moving, wedge shaped guide, it is possible to apply a constant force over distance on the rail. In particular, it is possible to make sure that the proper force is applied at the proper point by designing the linear motion and shape of the rail system. By that the wafer can be lifted off from the slice. The wedge shaped guide is in particular moved with a constant velocity v along a lengthwise extension of the rail as a moving direction. This is schematically depicted in FIG. 4. The crack propagation must be controlled to move only with the application of additional force; if the crack moves in an uncontrolled manner then unwanted surface topography will result in the wafer and the remaining block. If the stressing material does not have enough stiffness for a single rail, e.g. positioned along the diagonal, then additional rails can be positioned along the back side of the stressing layer. The attachment of the handles to the stressing layer must not add extra stresses through to the block or the topography of the wafer will be affected. Therefore it is convenient for the handle to be made of a material with similar properties (CTE, Young's modulus) to the stressing layer, as well as the bonding material between rail and handle. The rail must have some flexibility in the vertical plane so that it can bend upwards, conforming to the wedge-shaped guides.

By applying a mechanical force, i.e. a force with at least a component in a direction normal to the slice surface, in particular a force normal to said first plane side, a wafer can be peeled off from the slice. In addition to the normal force a shearing force can also be applied to the stressing means by way of said handle. It is ideal for the shear to be built in with the stressing layer and for the normal force to be applied through the interaction of the handle with the guide.

According to a further aspect of the invention the slice has at least a second plane side lying opposite to said first plane side. A holding means can be attached to said second plane side. The holding means can be a vacuum handle. It can also be a mechanical holding means. The holding means preferably comprises or is thermally connected to a cooling device for cooling the slice. The holding means can have a coefficient of thermal expansion matched to that of the slice.

According to a further aspect of the invention the stressing means is removed from said slice after the temperature change has been induced to said stack. When the stressing means is removed from said slice it preferably has a thin layer of crystalline material, i.e. a wafer attached to it. In particular, a crystalline wafer cleaved from said slice is removed together with the stressing means from said slice. Afterwards it can be removed from the stressing means. It can be in particular put into a holding device. Preferably the cleaved wafer has a thickness in the range of 50 μm to 500 μm, in particular in the range of 100 μm to 300 μm, in particular of less than 200 μm.

With thick slices, it is advantageous to attach stressing layers to both sides of the slice. In this case, the middle of the slice must be held by mechanical means while the wafers are being peeled from each side. Once the slice gets to a certain thickness, however, this middle confinement will no longer be feasible and it is necessary to transition to single side wafer forming.

According to a further aspect of the invention a plurality of slices is processed in parallel. In this way the throughput of the bonding and freezing steps can be increased. In one embodiment, rows of slices can be attached to a belt, for example a conveyor belt. The belt may be positioned above a heat exchanger to steadily lower the temperature as the belt pulls them forward. It can be advantageous to have the belt movement be intermittent instead of continuous. In this case, a vacuum force may be applied between the bottom of the belt and the top of the heat exchanger. This vacuum force will cause intimate physical contact between the heater, the belt and by extension the slice and handle, greatly enhancing heat transfer by conduction. After several belt positions to cool the slice to the desired temperature, the final position would hold the slice down while a robot arm would lower and engage the wedges with the handles, moving across to remove several wafers simultaneously. The slices would then proceed to receive new handles while the wafers would go to a separate stage to be removed from their handles.

In another embodiment, this same linear process is performed, but upside down. In this case, the slices would ride upside down along elongated rails, with cooling coming from the rail side. Once the target temperature is reached, the slices would be grabbed and moved linearly in the horizontal plane while the rail guide curves up and away, separating the wafers.

According to a further aspect to the invention the wafer is cleaned after being removed from the stressing means. This can be done in a separate processing chamber or a separate bath. Meanwhile the next wafer can be cleaved from the slice. The cleaning of the wafer can be done chemically and/or mechanically. For example, the wafer can be put into a cleaning bath after being removed from the stressing means. This can be done batchwise, i.e. several wafers can be cleaned simultaneously.

A further objective of the invention is to provide a device for cleaving wafers. This objective is solved by a device comprising a stressing means as described above.

According to a further aspect of the invention, the stressing means is applied directly to the first plane side of said slice. It is in particular applied to the slice without the need or use of a separate bonding agent. This is in particular possible, if a layer of liquid gallium is applied to the slice and then frozen into a solid so as to act as the stressing means.

Further aspects and details of the invention follow from the description of some embodiments.

DESCRIPTION OF THE PREFERRED EMBODIMENTS

Figure 1:
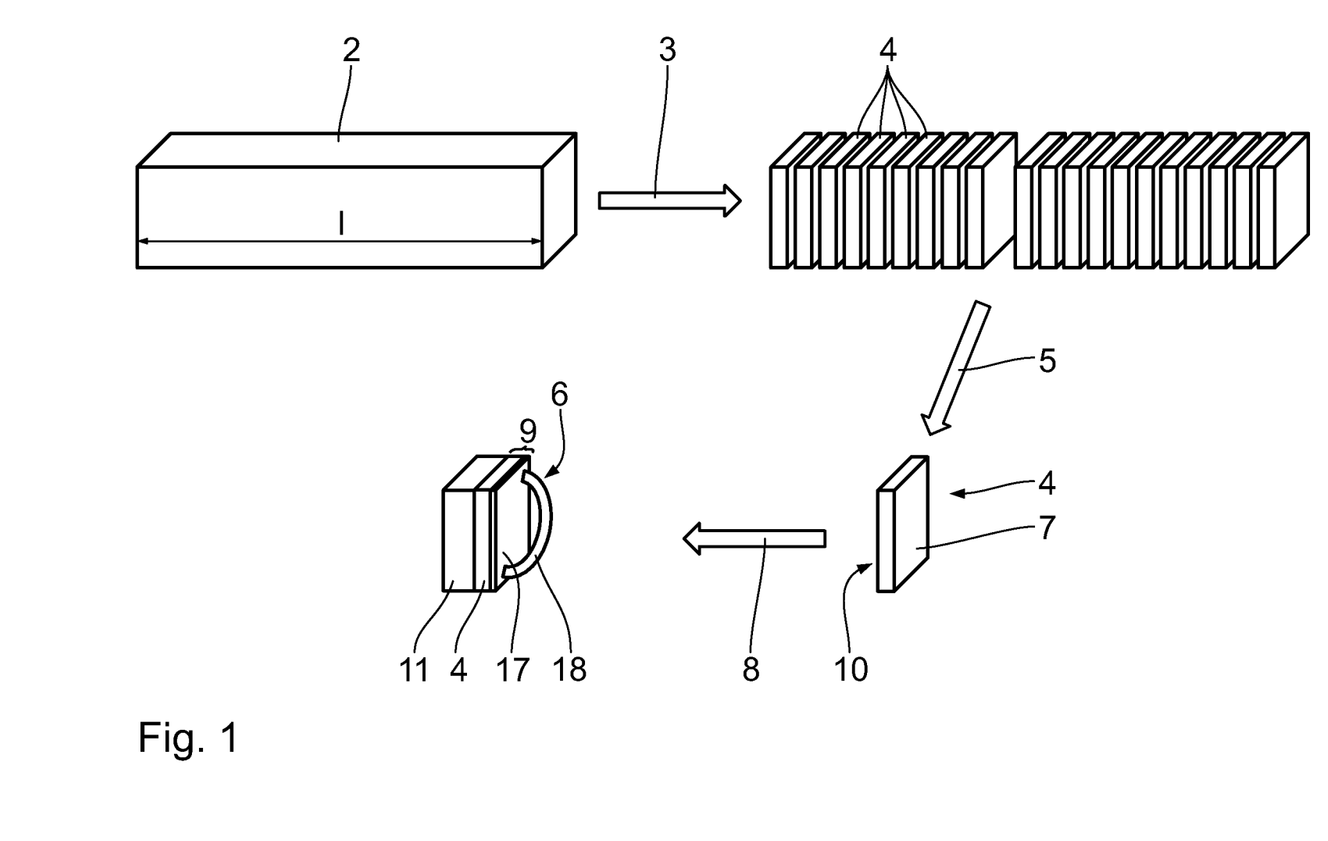
FIG. 1 a schematic depiction of the preparation for the cleaving process.

In the following method for cleaving wafers 1 is described. First a block of crystalline material, in particular a silicon block, also known as silicon ingot 2, is provided. The silicon ingot 2 can have a monocrystalline or quasi-monocrystalline structure. With the term quasi-monocrystalline a structure is denoted, which is at least in 50% of its volume, in particular at least in 70% of its volume, in particular at least in 90% of its volume monocrystalline.

The silicon ingot 2 has preferably a cylindrical or cuboid shape. It can have a length 1 of more than 20 cm, in particular more than 30 cm, in particular more than 50 cm. It can have a square or round cross section A. The cross section A can be at least 10 cm×10 cm, in particular at least 15 cm×15 cm, in particular at least 20 cm×20 cm, in particular at least 25 cm×25 cm, in particular at least 30 cm×30 cm.

In a first cutting step 3 the silicon ingot 2 is cut into slices 4. For this a wire sawing process can be used, i.e. the silicon ingot 2 is wire sawn into a number of slices 4.

The slices can have a thickness in the lengthwise direction of the silicon ingot 2 in the range of 0.3 mm to 300 mm, in particular in the range of 0.5 mm to 100 mm, in particular in the range of 1 mm to 50 mm. Their cross section can be identical to that of the silicon ingot 2. In the first cutting step 3 large bricks are divided into convenient sections.

After sawing the silicon slices 4 they are separated from each other in a separation step 5.

Then, a stressing means 6 is attached to a first plane side 7 of at least one of said slices 4 in an attachment step 8. The attachment step 8 is also referred to as a mounting step or bonding step.

Together the slice 4 and the stressing means 6 attached to it form a stack 9.

On a second plane side 10 laying opposite to the first plane side 7 a holding means 11 is attached. The holding means 11 can be attached to the slice 4 in the same attachment step 8 as the stressing means 6. It is also possible to attach the holding means 11 before or after the attachment step 8 of the stressing means 6 in a separate attachment step.

The stressing means 6 is preferably bonded to said slice by means of one of the following bonding agents: glue, in particular cyanoacrylate, wax, in particular organic wax, resin, in particular epoxy resin, a liquid with a freezing temperature near or below room temperature, in particular with the addition of a powder of a high strength material such as silicon carbide, glass and gallium.

Further, a notch 12 is applied to said slice 4. The notch 12 serves as crack initiation site. The notch 12 can be applied mechanically, in particular by use of a diamond knife, or a diamond indenter, i.e. a small diamond or silicon carbide tip, which is pushed directly into the slice 4. It can preferably also be applied by way of laser scribing. The notch 12 can also applied by sonic or ultrasonic means or by liquid pressure.

The notch 12 is preferably applied at a predetermined position of the slice 4. It is preferably applied at one corner of the slice 4 and at a depth measured from the first plane side 7 that corresponds to the desired thickness of the wafer 1. The desired thickness can be in the range of 50 μm to 500 μm, in particular in the range of 100 μm to 300 μm, in particular in the range of 140-200 μm.

Then a thermal shear stress is applied to said slice 4 by applying a temperature change to said stack 9. This is referred to as stressing step 13. According to an aspect of the invention the temperature change is applied by cooling the stack 9, without limitation, to temperatures below the bonding temperature of the bonding agent. The stressing step 13 is also referred to as controlled cooling step.

Figure 2:
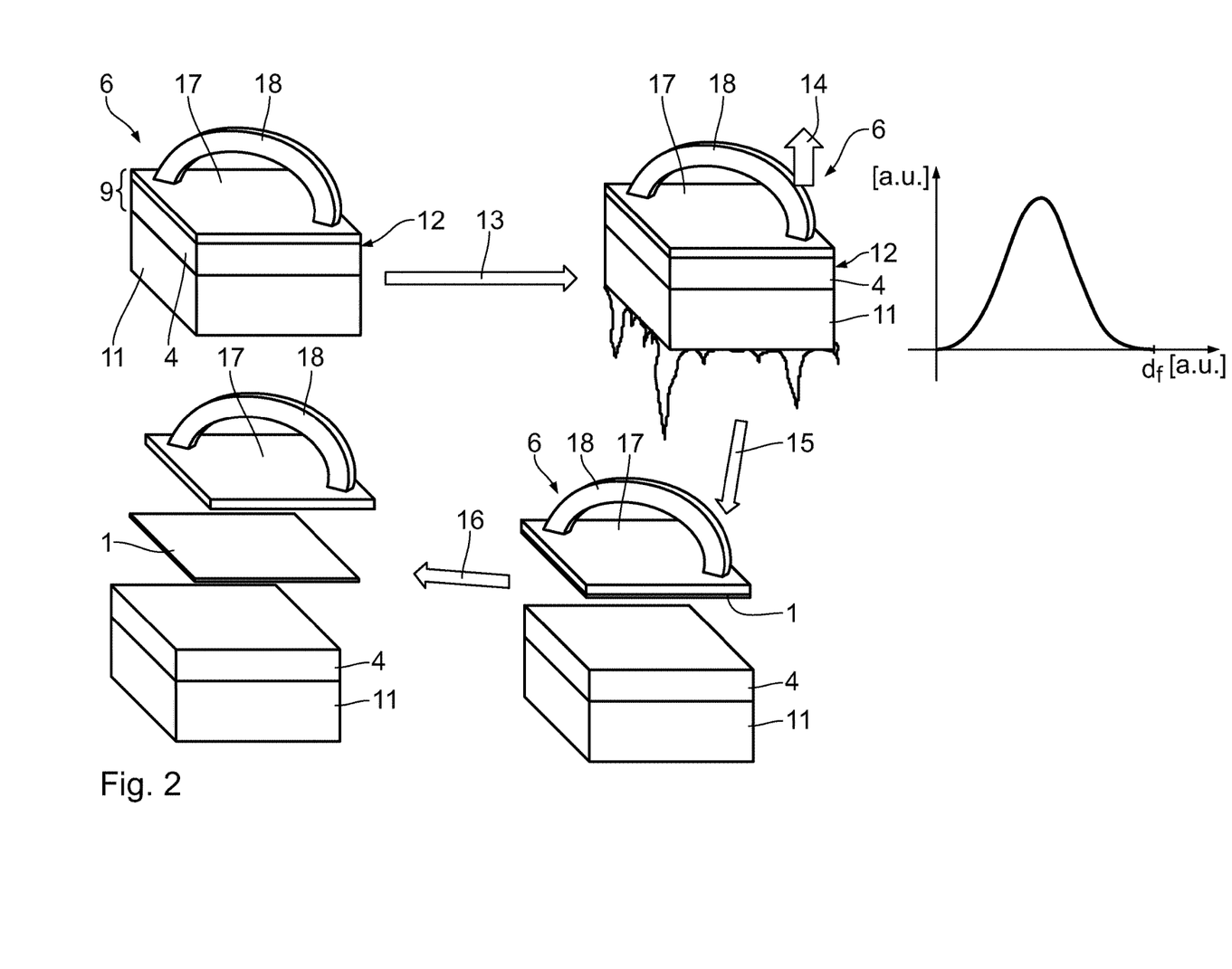
FIG. 2 a schematic depiction of the cracking and cleaving process.

Whilst the thermal shear stress is applied to said slice 4 a pulling force 14 can be applied to the stressing means 6 in order to apply a normal stress, i.e. a force in direction perpendicular to the first plane side 7, to said slice 4. The normal force is calibrated to be close to the minimum force necessary to propagate a crack. Similar to the physical effect where the friction to start an object moving is less than that to keep an object moving, crack movement requires the overcoming of an initial barrier. If the force is ramped up quickly, then an initial jump of crack length will result, which may be accompanied by a depth deflection. Therefore the force should be controlled carefully, especially on initiation, to stay below 140% of the force required to propagate the crack initially at the desired speed. Moreover, it is advantageous to propagate the crack diagonally across the face of the block, from one corner to the other, in order to have the finest level of control over the initiation of the crack. The energy required to propagate the crack is a linear function of the length of the crack front. In order to maintain a constant crack propagation speed, the force will have to be increased as the midpoint is approached and then decreased as the far corner is approached. In FIG. 2 there is shown an exemplary graph depicting the dependence of the pulling force 14 in arbitrary units from the cleave distance $d_f$ in arbitrary units.

The application of the thermal shear stress and/or the normal stress leads to a cleaving of the wafer 1 in a cleaving step 15.

The wafer 1 cleaved from the slice 4 is removed from the remainder of the slice 4. At that point of the process the wafer 1 is still attached to the stressing means 6.

Subsequently the wafer 1 is removed from the stressing means 6 in a separation step 16. This can be parallelized or facilitated by a warming of the stack 9. Correspondingly, the separation step 16 is also referred to as a warming step.

After the wafer 1 is removed from the stressing means 6 it can be put into a holder. The holder can hold a plurality of wafers. This is useful for a subsequent transport or further batchwise processing of the wafers 1. The wafers 1 are preferably cleaned after being removed from the stressing means 6. Such cleaning is preferably performed batchwise, but could also be done through in-line processes.

The cleaning of the cleaved wafers 1 can be done, whilst the next wafer 1 is cleaved from the slice 4.

The stressing means 6 forms a part of a device for cleaving wafers 1.

In the following further aspects of the invention are described:

One of the advantages of the present invention is the increased yield. The percentage of material, which is lost, when separating the wafers 1 from the silicon ingot 2, in particular the slice 4, is greatly reduced. Even with a thickness of the wafers 1 of less than 500 μm, in particular less than 200 μm, the percentage of material lost can be kept below 30%, in particular below 20%, in particular below 10%. Furthermore, unlike for the silicon lost as kerf, silicon lost in this process is relatively easy to re-melt and process into new crystal.

Figure 3:
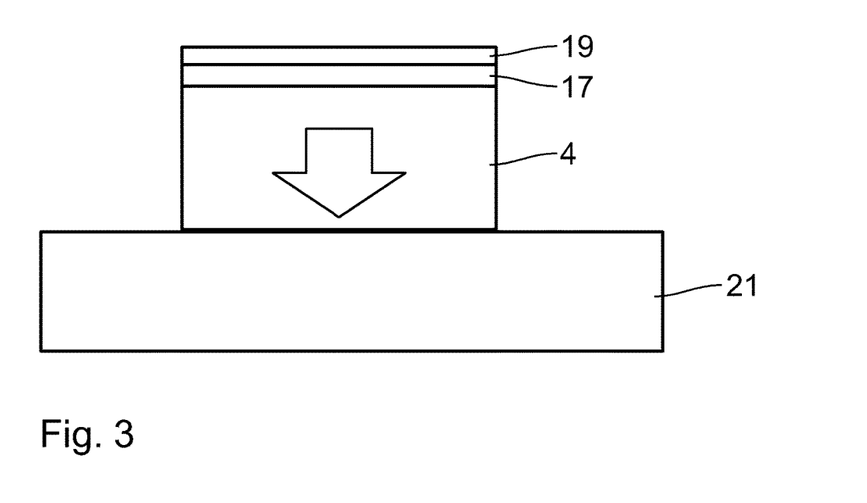
FIG. 3 a schematic depiction of a device for cleaving wafers.

The stressing means 6 comprises a stressing layer 17. The stressing layer 17 can be formed as a block, slab, sheet, deposition or as a perforated or mesh-like structure. The stressing layer 17 can also comprise strips of material. The strips of the stressing layer 17 are preferably arranged in parallel. They can be cross-linked with plastic. The stressing layer 17 can comprise channels and/or holes, in particular drilled holes, to circulate heat exchange liquids and/or chemical, in particular, to dissolve the bonding layer.

The stressing layer 17 can in particular be reusable. It can be made of a bulk solid material. The stressing layer 17 can in particular comprise or be a stiff aluminum layer.

Preferably, the stressing layer 17 comprises a shape where the bonding surface is large relative to the thickness, such that plane stress conditions apply. In particular, the ratio between one lateral dimension of the wafer and the intended thickness of the wafer should be at least 20:1, and preferably more than 200:1 and could be as high as 3000:1.

The stressing layer 17 can be attached directly to the first plane side 7 of the slice 4. It can in other words be in direct physical contact with the first plane side 7 of the slice 4. It can also be attached to the first plane side 7 by way of a separate attachment layer. The attachment layer can comprise a bonding agent such as described above.

The stressing means 6 further comprises a handle 18. The handle 18 can be in form of a rail 19. The rail 19 can have T-shaped cross section. There can be more than one handle 18, in particular more than one rail 19 being attached to the stressing layer 17.

In order to apply a force, in particular a normal force, to the stressing means 6, in particular to the rail 19 a wedge shaped guide 22 can be moved along the rail 19. By using a moving, wedge shaped guide 22, it is possible to apply a constant force over distance on the rail 19. By that the wafer 1 can be lifted off from the slice 4. The wedge shaped guide 22 is in particular moved with a constant velocity v along a lengthwise extension of the rail 19 as a moving direction 23. This is schematically depicted in FIG. 4. The velocity v can be in the range of 1 mm/s to 1 m/s, particularly in the range of 5 mm/s to 20 cm/s. For a wafer with a diagonal dimension of 22 cm, this results in cycle times ranging from 1 second to 2 minutes.

The stressing means 6 is at least in parts made of a material with coefficient of thermal expansion (CTE) different from that of the slice 4. In particular, the stressing layer 17 is made of a material with a CTE different from that of the slice 4. The CTE of the stressing layer 17 is in particular at least 5 ppm/K, in particular at least 8 ppm/K, in particular at least 12 ppm/K, in particular at least 20 ppm/K. In other words the stressing layer 17 is made of a stressing material.

The stressing material preferably has a high strength. It preferably has a Young's modulus greater than or equal to that of silicon.

The stressing means 6 is at least in parts made of one or more of the following materials: a metal, in particular, aluminum, silver, gallium, copper, zinc, manganese and their compounds, steel, plastic, in particular acrylic, polycarbonate (PC), in particular glass-filled PC. In particular, the stressing layer 17 is made of one or more of these materials. Gallium can be particularly advantageous for the stressing layer 17, as it has a very high CTE. Furthermore, it has a low melting point, which facilitates its application to the first plane side of the slice 4.

The stressing layer 17 has the same cross section as the slice 4. It can also have a larger cross section than the slice 4. The stressing layer 17 preferably has a thickness in the range of 0.1 mm to 10 mm.

It preferably displays some pliability. An embodiment of the stressing layer 17 which has some pliability can facilitate the pulling off of the wafer 1 from the slice 4 by enabling the stressing layer 17 to bend slightly, maintaining a purely normal applied stress at the crack tip. This can be achieved by maintaining a constant radius of curvature of the rail guide, or by letting the radius of curvature of the rail guide increase after the wafer separation point.

According to another aspect of the invention, the thickness, and/or the design of the stressing layer 17 are preferably sufficient, that it can provide a uniform stress field across the entire first plane side 7 of the slice 4. It is furthermore preferably stiff and sturdy enough to mask any inhomogeneities from the attachment points of the handle 18.

The stressing layer 17 can be transparent. It can in particular be transparent to UV-light. It can in particular have a transmission for light with a wavelength in the range of 200 nm to 400 nm of at least 50%, in particular at least 70%.

Due to the large coefficient of thermal expansion of the stressing layer 17 the application of a temperature change to the stack 9 induces a shear stress to the slice 4. The shear stress will lead to a crack propagation initiating at the notch 12 through the slice. It was found that the crack propagation can be controlled by controlling the temperature field, in particular by controlling the temperature change, in particular by controlling the cooling applied to the stack 9. The specific condition for the propagation of a crack is that the critical shear stress, $K_{IIC}$, be zero. This will happen at a certain depth away from the stressing layer that increases non-linearly with increasing magnitude of the stress imposed by the layer (and therefore increasing $\Delta T$ from the bonding temperature). Therefore the wafer thickness can be chosen based on the temperature at which the cleaving is initiated via force on the handle. Care must be taken to control this temperature carefully, since overshooting the target temperature or too rapidly cooling the stack may cause spontaneous fracture, with uncontrolled crack propagation and instability in the crack tip direction. It is therefore an aspect of this invention that the cooling rate be controlled to be slower than 1 K/s within 30 degrees of the target temperature, and that the temperature should not be allowed to dip below twenty degrees below the target temperature, since this provides significant risk of spontaneous cleaving.

The crack propagation can in particular be controlled to be parallel to the first plane side 7 of the slice 4. The depth relative to the first plane side 7 can be controlled through the temperature and material selection of the stressing layer 17, in particular by choosing a material for the stressing layer with a prescribed CTE and Young's modulus, and then determining the temperature difference that produces the proper thickness. Even if the crack initiation notch is placed at a level different from the equilibrium crack propagation depth, the crack will seek out that depth and then maintain it. Therefore the correct target temperature can be determined either empirically by trial and error, or with proper analytical modeling the depth can be predicted to within 5%.

(111) planes are especially favorable for crack propagation due to the large inter-plane spacing. however, it has been shown that cracks can be made to travel in arbitrary directions through the slice 4. For controlling the direction of crack propagation it is in particular envisaged to apply a normal stress to the stressing means 6, in particular to the stressing layer 17 by way of the handle 18. For that the handle 18 can be pulled away from the slice 4. It was in particular found that wafers 1 could be successfully cleaved from silicon slices 4 with a first plane side 7 parallel to a (100) direction. Thus, the wafers 1 produced by the current method can in particular have a (111) oriented surface or a (100) oriented surface.

With the above mentioned method it was possible to cleave wafers 1, which had a average thickness of 170 µm+/−70 µm. The wafers 1 had an average roughness of 3 µm, measured with a stylus-type profilometer.

According to another aspect of the invention the temperature range, to which the stack 9 comprising the slice 4 and the stressing means 6 is exposed, lays in the range of −200° C. to +150° C. The maximal temperature can be preferably less than +120° C., in particular less than +80° C. According to an aspect of the invention the temperature change is applied by cooling the stack 9 from room temperature, in particular from about 20° C. The stack 9 can be cooled down to about −40° C. By keeping the maximal temperature reached during the process below 120° C., in particular below 80° C., in very particular below 30° C., the risk of alloying of the stressing layer and the slice, i.e. the risk of contamination of the slice can be reduced, in particular avoided.

The stack can be cooled down by thermal conduction. For that, the slice 4 is brought in contact with a cool reservoir 21. Alternatively, the stack 9 is cooled down by placing it in a cold environment with or without convection, in particular a cooling chamber. Alternately, a cooling fluid could be circulated and/or evaporated through channels in the holding means 11. The cool reservoir 21 or the cooling chamber can be held at a constant temperature $T_{cool}$. It can also be connected to a temperature controller, by means of which the temperature of the cool reservoir 21 or the cooling chamber can be controlled to follow a predescribed timecourse. The cooling rate of the slice 4 can be controlled through the temperature $T_{cool}$ of the cool reservoir 21. The cooling rate can be further controlled by the thickness of the slice 4. By controlling the cooling rate it is possible to avoid spontaneous cleaving. The cooling rate can be larger than 10 K/min, in particular larger than 20 K/min.

As a cooling means dry ice or liquid nitrogen can be used.

According to another aspect of the invention, the stressing layer 17 is a continuous solid or may be a perforated material or a mesh layer. The perforation or mesh openings can facilitate the release, in particular the debonding of the wafer 1 from the stressing means 6 after cleaving.

According to another aspect of the invention it might be necessary to prepare the slice 4 in order to make sure that the first side 7 is sufficiently planar. For example, it may be advantageous to put the slice through an etching step either for the purpose of planarizing the surface or of texturizing it for better bonding. Alternately, mechanical polishing or chemical-mechanical planarization can be used to attain the desired flatness and surface roughness of the slice surface. In particular, the wafer is desired to have an overall absolute flatness variation of less than 20 microns. It is not necessary to have extremely smooth topography for this process, and a roughness of some magnitude may be useful for maintaining a strong bond to the stressing layer.

According to another aspect of the invention, the application of the notch 12 serving as crack initiation can be done before the stressing means 6 is attached to the slice 4. It can also be applied after the stressing means 6 has been attached to the slice 4. A specific method of crack initiation is the use of a nanoindenter to form the initial crack. For example, an indenter with a pyramidal or blade shaped tip can be used to make initial cracks by pushing directly into the silicon with a force exceeding the yield stress. The shape of the tip will determine the orientation of the starter crack, so it may be made to coincide with the orientation of the desired separation plane.

Another advantage of the invention is the easiness of its implementation. Apart from the attachment of the stressing means 6 to the slice 4 it requires only simple thermal cycling in the temperature range given above. Due to the difference in the contraction between the stressing layer 17 and the slice 4 because of the differences in the respective CTEs a shear stress is induced in the slice.

Normal stress can be applied to the stressing means 6 by way of the handle 18, in particular by way of a vacuum handle. Thus, a vacuum handle is envisioned to apply the mechanical stress necessary to propagate the crack. The benefit of a vacuum handle is that it provides uniform pressure over the surface of the stressing layer without inducing any additional shear stress. It can also be attached and detached without the need to use a bonding agent that would later need to be removed. Force, for example from the guide rail, can be applied to a handle attached to the back side of the vacuum plenum.

According to another aspect of the invention either a thermal setting wax or epoxy, or a UV-activated epoxy is used as the high CTE material of the stressing layer 17. Such a material can also be used as a separate attachwent layer to bond the slice 4 to the high CTE material. It can in particular be used to bond the slice 4 to a thin layer of high CTE material.

Once the wafer 1 is separated from the slice 4, the detachment from the stressing means 6, in particular the detachment of the attachment layer can be accomplished elsewhere while the next wafer 1 is being pulled from the slice 4.

According to another aspect of the invention it was found that it can be advantageous to sharpen the notch 12 after it has been formed. If it was found that by sharpening the crack its propagation can be facilitated. In particular, the controlled propagation of the crack starting from the notch 12 can be facilitated.

According to another aspect of the invention to bond the stressing means 6 to the first side 7 of the slice 4 one of several bonding agents can be used. In order to have a production friendly process, the bond needs to be both strong enough to withstand the significant stresses that will be placed on it, and fast enough to prevent the process from taking hours per wafer. Possible bonding agents are a thermal setting wax, such as CrystalBond™, which softens to a liquid at about 80° C., bonds the stressing means 6 to the slice 4 with a thin layer and then forms a very strong bond as it is cooled down to room temperature and below. Furthermore, this bonding agent has the advantage of facilitating easy debonding. In order to debond, i.e. separate the wafer 1 from the stressing layer 17 only a warming up to about 80° C. is needed. Furthermore, excess wax can be recovered and recycled and residue can be handled with a solvent.

Another option for a bonding agent is a UV-activated epoxy. In that case, it is envisioned to use a transparent material for the stressing means 6, in particular for the stressing layer 17. The stressing layer 17 should be at least in parts transparent, in particular transparent to UV-light. In this case the epoxy is applied to the slice 4, and then the stressing means 7 is attached to the slice 4 to form the stack 9, whilst the epoxy is still soft, in particular still liquid. Then the excess epoxy can be cleaned off from the stack 9 and then the epoxy is exposed to UV-light to quickly set. For releasing the cleaved wafer 1 from the stressing layer 17 a dissolution process can be used. This can be improved by structuring the stressing layer 17 to have extra access points, in particular in form of holes connected to a fluid flowing cavity or plenum. By that, it is possible to introduce solvents into the space between the stressing means 6, in particular the stressing layer 17 and the slice 4. Alternately, the stressing layer 17 and wafer 1 can be separated by raising the temperature high enough so that the epoxy breaks down and loses its bonding strength.

Another possibility is the use of a liquid, in particular water, as bonding agent. The liquid can be optionally loaded with a suspension of small glass or ceramic particles. In this case, a thin layer of the liquid, in particular a thin layer of water, is placed between the slice 4 and the stressing means 6, in particular the stressing layer 17. Then, the two are brought below freezing and the ice forms the bonding layer. Particularly convenient can be the use of a metal or an alloy with a low melting point, in particular a metal or an alloy with a melting point in the range of 20° C. to 80° C., as bonding agent. If the metal has suitable mechanical properties, as in the case of gallium and some low temperature eutectics, then the liquid may be frozen as a thin layer that is used as a stressing layer without any separate bonding layer.

According to another aspect of the invention, the side 10 of the slice 4 lying opposite to the side 7 to which the stressing means 6 is attached is temporarily or permanently affixed to a handle as the holding means 11. The holding means 11 can be made of a material with roughly matching or slightly lower CTE than the material of the slice 4, in particular the CTE of silicon. The CTE of the material of the holding means 11 can in particular be in the range of 0.8 to 1.1 times the CTE of the material of the slice 4, in particular in the range of 0.9 to 1.0 times the CTE of the material of the slice 4.

The holding means 11 can be held on by vacuum forces through a plenum or through the use of a bonding layer similar to that used to attach the stressing means 6 to the slice 4. Furthermore, the holding means 11 is preferably mounted or fixed tightly to the slice 4. This facilitates the application of a normal force on the stressing layer by balancing that force and preventing translation of the stack, thus facilitating the cleaving process.

According to another aspect of the invention, the stressing means 6 is pulled away from the slice 4 by means of the handle 18, with the application of the pulling force starting at the corner with the notch 12 and pulling diagonally across the face of the slice 4, i.e. the first side 7, until the complete wafer 1 has been separated from the slice 4.

According to another aspect a second stressing means 6, which is identical to the first stressing means 6, can then be attached to the remaining slice 4 in order to start the next cycle of cleaving, whilst the cleaved wafer 1 can be debonded, i.e. released from the stressing layer 17 and/or further processed.

According to another aspect of the invention the stressing layer 17 is applied by physical vapor deposition (PVD). In particular, aluminum can be applied as stressing layer 17 by way of a PVD-process.

Also, some of the low melting point metals may be used for the stressing layer 17. In particular, gallium can be painted onto the slice 4 as a liquid at room temperature and then be frozen in place. Gallium has the advantage of providing the highest CTE of any element, namely 123 ppm/K. Thus, it requires less cooling than other materials to get the target thickness of the wafer 1. Also, it can induce a particularly large thermal shearing stress in the slice 4 for a given temperature change. After cleaving, it can be easily be removed and recovered by melting it again at room temperature.

Figure 6:
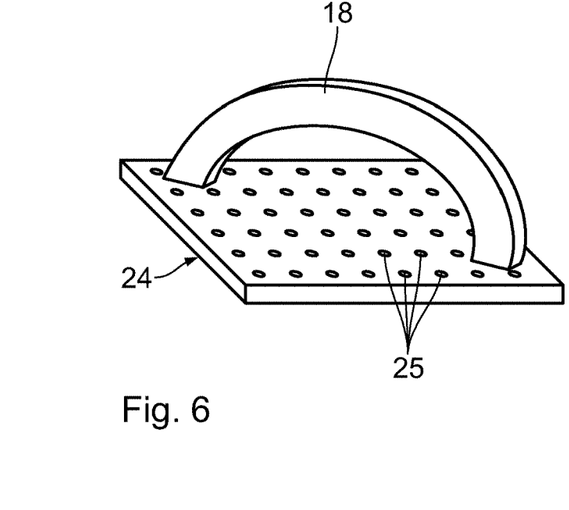
FIG. 6 a view of another embodiment of a device for cleaving wafers.

According to another aspect of the invention, the stressing layer 17 can be in the form of a permeated or a perforated plate 24, in particular a plate permeated or perforated with holes 25. The holes 25 can allow infiltration of dissolving chemicals. The stressing layer 17 could also be formed as a mesh of wires. This would facilitate the infiltration of the bonding agent and/or dissolving chemicals. It would also allow the use of UV-curing through the open weave structure. The requirement is that the perforating holes or mesh openings be small enough and regular enough to prevent lateral variations in the applied shear stress. The holes or openings can have a size in particular a diameter in the range of 0.01 mm to 2.0 mm, preferably in the range of 0.1 mm to 0.5 mm. They are preferably arranged with a spacing on the border of 2-10 times the size of the hole. The best hole arrangement is a hexagonal pattern, although other patterns are acceptable, e.g. square or rhombic symmetry.

According to another aspect of the invention, the stressing layer 17 can have a multi-layer structure. Herein different layers can achieve different functions. In particular, one layer can be used for bonding and debonding the slice 4 to the stressing means 6 while the second layer could be the primary stress-inducing layer. Preferably, each layer of such a multi-layer stressing layer 17 is suitable to apply and/or transfer enough stress through to the slice 4.

Further advantages of the present invention are the reduced operating costs, which comprise the cost for the energy necessary for the heating and cooling, the cost of the bonding material and debonding chemicals and longer lived consumables such as the handle 18. Furthermore, the total yield can be greatly enlarged. The yield of producing wafers 1 from the silicon ingot 2 can be larger than 50%, in particular larger than 70%, in particular larger than 90%, in particular larger than 95%. In particular, damaged wafers can be recovered and remelted.

Figure 7:
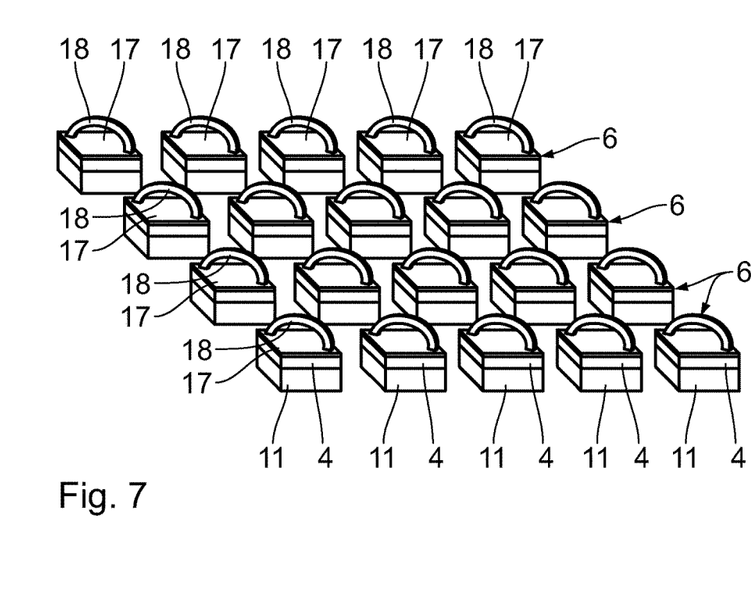
FIG. 7 a schematic drawing showing a parallelization of the process.

According to another aspect of the invention the throughput of the process, i.e. the average time needed to cleave the wafers 1 from the slice 4 can be enhanced by a parallelization of the process. As schematically shown in FIG. 7, several wafers 1 can be cleaved simultaneously from different slices 4. By this the net per-piece process time can be reduced to less than 1 minute per wafer.

Figure 8:
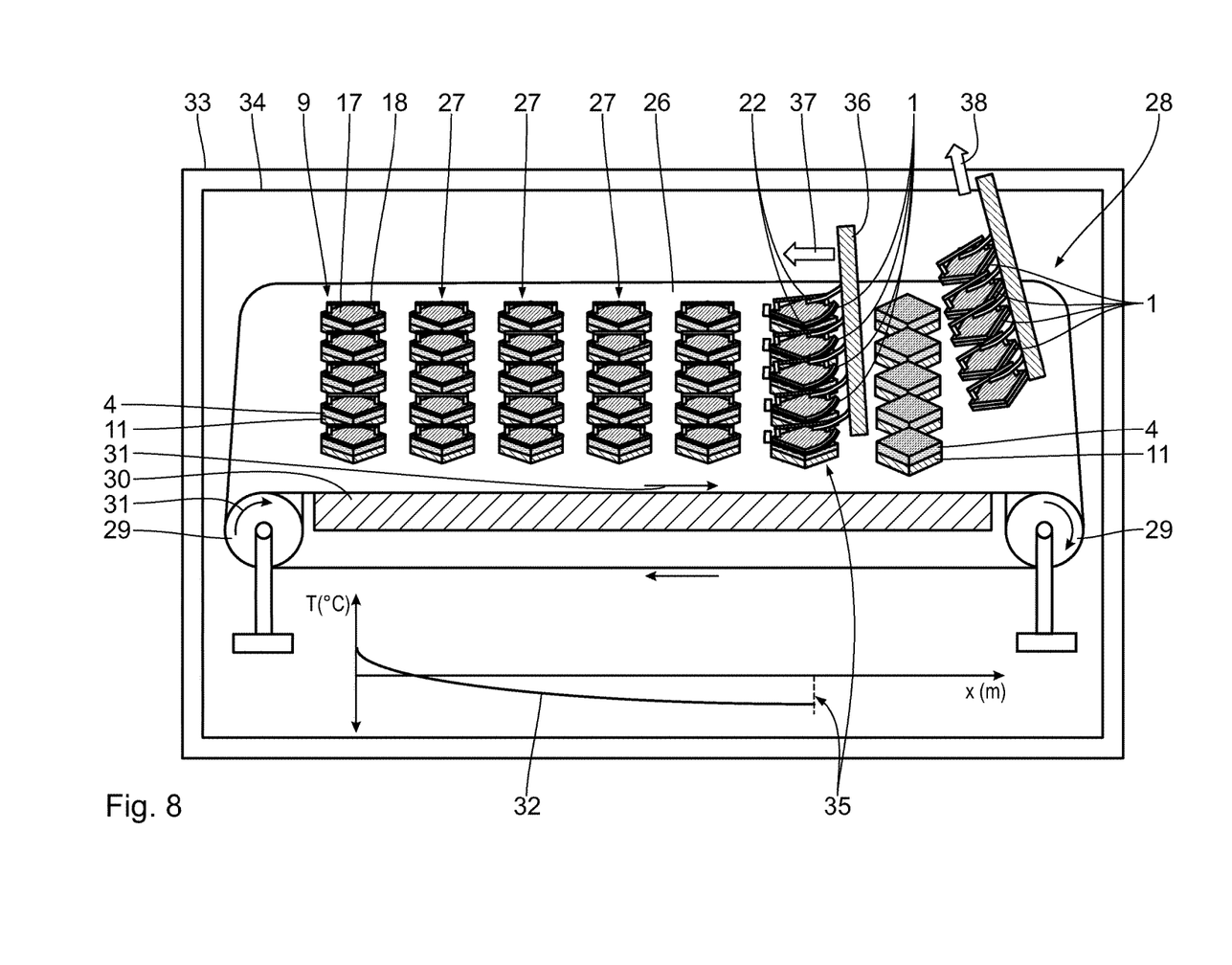
FIG. 8 a schematic drawing showing a device for parallel processing of a plurality of slices in parallel.

FIG. 8 shows an exemplary device for parallel processing of a plurality of slices 4. As shown in FIG. 8, the slices 4 can be attached to a belt 26, in particular a conveyer belt. The slices 4 can be attached to the belt 26 in rows 27. Each row 27 can comprise several slices 4. According to the device shown in FIG. 8, each row 27 comprises five slices 4. It is also possible to have rows 27 with a different number of slices 4. The number of slices 4 per row 27 can be in the range of 1 to 20 or more, in particular in the range of 3 to 10.

The slices 4 in each row 27 are preferably aligned to each other. This facilitates the parallel processing of the slices 4.

The conveyer belt 27 can be part of a conveyer system 28. The conveyer system 28 further comprises a conveyer drive, in particular with conveyer drums 29. At least one of the conveyer drums 29 can comprise a drive mechanism. Preferably, both of the conveyer drums 29 comprise a drive mechanism.

The conveyer belt 26 can be driven continuously. It can be also advantageous to drive the conveyer belt 26 intermittently.

The conveyer belt 26 is positioned above a heat exchanger 30. By that, the temperature of the slices can be steadily lowered as the belt 26 pulls them forward in a conveying direction 31. For exemplary purposes a temperature curve 32, depicting the temperature of the slices 4 on the conveyer belt 26, versus the position in the conveying direction 31 is schematically shown in the lower part of FIG. 8.

As schematically depicted in FIG. 8, the conveyer system 28 is placed in a container 33. The container 33 can be closed. It is in particular insulated, in particular thermally insulated. In general, the conveyer 26 is at least covered by an insulation 34. The insulation 34 is placed over the top of the conveyer 26. Preferably, it covers the conveyer 26.

Preferably, a vacuum force can be applied between the conveyer belt 26 and the heat exchanger 30. By this the belt 26 can be drawn towards the heat exchanger 30. The vacuum force will in particular course intimate physical contact between the heat exchanger 30 and the conveyer belt 26. In addition, as the belt 26 can be gas permeable, the vacuum force can course intimate physical contact between the stacks 9 comprising the slices 4 and the stressing means 6 and the conveyer belt 26. Thereby the heat transfer by conduction from the heat exchanger 30 to the stacks 9 is greatly enhanced.

Furthermore, at a predetermined belt position, preferred to as removal position 35, the slices 4 are held down, while a robot arm 36 is lowered and engages the guides 22 with the handle 18, moving across to remove several wafers 1 simultaneously. As shown in FIG. 8, the wedge shaped guides 22 can have the form of shoe horns. This allows a very easy lifting of the wafers 1 from the slices 4.

With the conveyer belt 26 being driven intermittently, the removal position 35 can be at a predetermined discrete position. In FIG. 8 the removal position 35 is exemplary shown to be the sixth position. It can also be the second, third, fourth, fifth or any other discrete position on the conveyer belt.

After having engaged the handles 18 with the wafers 1 in an engagement step 37 and after having separated the wafers 1 from the slices 4, the stressing means 6 with the wafers 1 attached to them can be lifted away from the conveyer belt 26 in a removal step 38. The wafers 1 can then be processed further as described.

The remainders of the slices 4 can at the same time proceed to have new stressing means 6 attached to them.

In another embodiment, same linear process is performed, but upside down. In this case, the stacks 9 comprising the slices 4 with the stressing means 6 attached to them ride upside down along elongated rails, with cooling coming from the rail side. Once the target temperature is reached, the slices 4 are grabbed and moved linearly in the horizontal plane while the rail guide curves up and away separating the wafers 1 from the slices 4.

According to a further aspect of the invention the stressing means 6 is attached or applied to the slice 4 at or near room temperature. Then stress is applied by cooling the stack 9 to a lower temperature. One of the advantages of this method is that the risk of contamination of the slice, in particular the risk of an alloy formation between the material of the stressing layer 17 and the slice 4 and the risk of either dislocation formation or impurity diffusion and contamination within the crystal structure of the slice 4 is greatly reduced at such low temperatures (compared, e.g., with the alloying of aluminum paste).

As already mentioned above, it can be advantageous to combine several different materials in the stressing means 6 in order to improve one or more of the following: adhesion, strength, thermal expansion and thereby shear stress induced in the slice, ability to remove. Possible combinations are for example a combination of a stressing layer 17 comprising a metal or being built as a metal layer and an attachment or adhesion layer comprising glue or being made of glue.

Whereas the glue can provide improved adhesion, the metal layer provides thermal expansion by way of its CTE and strength.

Another combination can be a high CTE stressing layer 17 and an adhesion layer comprising or being made of an adhesive wax. The latter allows thermal setting, heat up and melt both for its application and removal.

Another combination can be a perforated or mesh-like metal layer as a stressing layer 17 with an adhesive polymer, in particular with light activation, e.g. UV-curing. The perforated or mesh-like structure allows easy access for chemical glue removal. The mesh-like structure can be made of a number of wires or metal threads.

According to another aspect of the invention it can be advantageous to build the stressing layer 17 such that it displays a non-isotropic thermal expansion. The stressing layer 17 can in particular display a non-isotropic thermal expansion in a plane parallel to the first plane side 7 of the slice 4, i.e. display a thermal expansion, which is larger in a first direction within that plane than in a second direction within that plane.

As it has been shown, with the method described above it is possible to cleave wafers 1 which have a thickness in the range of 50 µm to 500 µm, in particular in the range of 100 µm to 300 µm, in particular of less than 200 µm, in a cost-efficient manner compatible with the needs of solar cells and modules.

What is claimed is:

1. A method for cleaving wafers, the method comprising:
providing a slice of a crystalline material, said slice having at least a first plane side;
providing at least one stressing means to be attached to said slice, said at least one stressing means is at least in parts made of a material with a coefficient of thermal expansion (CTE) different from that of the slice, and the at least one stressing means comprising a stressing layer formed as one of a perforated structure and a meshlike structure;
attaching said at least one stressing means to said first plane side of said slice to form a stack;
applying a notch to said slice;
cooling down said stack to induce a thermal shear stress to said slice; and
applying a pulling force to said slice in a direction perpendicular to said first plane side via said at least one stressing means during the cooling down of said stack.

2. The method according to claim 1, wherein the stressing layer is permeable for at least one of light and a chemical.

3. The method according to claim 1, wherein
said at least one stressing means and a portion of said slice are moved in a vertical direction to generate the pulling force applied to said slice to detach said portion from said slice,
said vertical direction being perpendicular to said first plane side, and
said at least one stressing means is at least in part made of at least one of the following materials: silver, aluminum, zinc, gallium, copper, manganese and their compounds, steel, and plastic.

4. The method according to claim 1, wherein
said pulling force applied to said slice is produced by moving said at least one stressing means in an upward direction,
said upward direction being perpendicular to said first plane side, and
the material has a CTE of at least 5 ppm/K.

5. The method according to claim 1, wherein
said at least one stressing means is moved in a vertical direction to produce said pulling force applied on said slice,
said vertical direction being perpendicular to said first plane side,
said at least one stressing means is bonded to said slice by means of one of the following bonding agents: glue, wax, resin and freezing liquid, and
said slice and said at least one stressing means are cooled to a temperature below a bonding temperature of said bonding agent.

6. The method according to claim 1, wherein said stack is cooled to minus forty degrees Celsius.

7. The method according to claim 1, wherein
the at least one stressing means comprises a coating being applied to said first plane side of said slice, and
the pulling force is applied to said slice by moving the at least one stressing means in the direction perpendicular to the first plane side.

8. The method according to claim 1, wherein said stressing means comprises a handle and the pulling force is applied to the slice by applying a mechanical force to said handle.

9. The method according to claim 1, wherein the slice has one of a cylindrical and a cuboid shape with a thickness in the range of 1 mm to 50 mm.

10. The method according to claim 1, wherein the slice has at least a second plane side lying opposite to said first plane side and a holding means is attached to said second plane side.

11. The method according to claim 1, wherein a plurality of slices is processed in parallel.

12. The method according to claim 1, wherein the at least one stressing means and a wafer are removed from said slice after said stack has cooled down.

13. The method according to claim 1, wherein a crystalline wafer cleaved from said slice is removed from the at least one stressing means by decomposing a bonding layer.

14. The method according to claim 1, wherein the slice is cut from a silicon ingot.

15. The method according to claim 1, wherein a cleaved wafer has a thickness in a range of 50 µm to 500 µm.

16. The method according to claim 1, wherein a cleaved wafer has a thickness in a range of 100 µm to 300 µm.

17. The method according to claim 1, wherein said notch is applied to said slice after cooling down said stack.

18. The method according to claim 1, wherein said one of said perforated structure and said meshlike structure is a mesh component having a plurality of mesh openings.

19. A method for cleaving wafers, the method comprising:
providing a slice of a crystalline material, said slice having at least a first plane side;
providing at least one stressing means to be attached to said slice, a portion of said at least one stressing means comprising a material with a coefficient of thermal expansion (CTE) different from a CTE of the slice, said at least one stressing means comprising a stressing layer, and said stressing layer comprising one of a perforated structure and a mesh structure;
attaching said at least one stressing means to said first plane side of said slice to form a stack;
applying a notch to said slice;
cooling down said stack to induce a thermal shear stress to said slice; and
applying a pulling force to said stack in a direction perpendicular to said first plane side via said at least one stressing means during the cooling of said stack such that a portion of said slice is detached from another portion of said slice to form a wafer.

20. A method for cleaving wafers, the method comprising:
providing a slice of a crystalline material, said slice having at least a first plane side;
providing at least one stressing means to be attached to said slice, a portion of said at least one stressing means comprising a material with a coefficient of thermal expansion (CTE) different from a CTE of the slice, said at least one stressing means comprising a stressing layer, and said stressing layer comprising one of a perforated structure and a mesh structure;
connecting said at least one stressing means to said first plane side of said slice to form a stack;
applying a notch to said slice;
cooling said stack to induce a thermal shear stress to said slice; and
applying a pulling force to said stack in a direction perpendicular to said first plane side during the cooling of said slice by moving said at least one stressing means and a portion of said slice detachably connected to said at least one stressing means in an upward direction such that said portion of said slice is detached from another portion of said slice to form a wafer.

21. The method according to claim 20, wherein said at least one stressing means is cooled with said at least one stressing means connected to said slice to provide a cooled stack.

22. The method according to claim 21, wherein
said at least one stressing means is bonded to said slice via a bonding agent,
said slice and said at least one stressing means cooled to a temperature below a bonding temperature of said bonding agent, and
said wafer has a thickness in a range of 50 µm to 500 µm.

23. A method for cleaving wafers, the method comprising:
providing a slice of a crystalline material, said slice having at least a first plane side;
providing at least one stressing means to be attached to said slice, a portion of said at least one stressing means comprising a material with a coefficient of thermal expansion (CTE) different from a CTE of the slice, said at least one stressing means comprising a stressing a layer, and said stressing layer comprising one of a perforated structure and a mesh structure;
attaching said at least one stressing means to said first plane side of said slice to form a stack;
cooling said stack to induce a thermal shear stress to said slice;
applying a notch to said slice after the cooling of said stack; and
applying a pulling force to said cooled stack in a direction perpendicular to said first plane side via said at least one stressing means during the cooling of said stack, such that a portion of said slice is detached from another portion of said slice to form a wafer.

24. A method for cleaving wafers, the method comprising:
providing a slice of a crystalline material, said slice having at least a first plane side;
providing at least one stressing means to be attached to said slice, a portion of said at least one stressing means comprising a material with a coefficient of thermal expansion (CTE) different from a CTE of the slice, said at least one stressing means comprising a stressing layer, and said stressing layer comprising a mesh structure;
attaching said at least one stressing means to said first plane side of said slice to form a stack;
applying a notch to said slice;
cooling said stack to induce a thermal shear stress to said slice; and
applying a pulling force to said stack via said at least one stressing means, said Dulling force being in a direction perpendicular to the first plane side, such that a portion of said slice is detached from another portion of said slice to form a wafer.

* * * * *